(12) United States Patent
Kaynak et al.

(10) Patent No.: US 11,923,868 B1
(45) Date of Patent: Mar. 5, 2024

(54) STALL MITIGATION IN ITERATIVE DECODERS

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/890,993

(22) Filed: Aug. 18, 2022

(51) Int. Cl.
*H03M 13/00* (2006.01)
*H03M 13/01* (2006.01)
*H03M 13/11* (2006.01)

(52) U.S. Cl.
CPC ..... *H03M 13/1108* (2013.01); *H03M 13/015* (2013.01); *H03M 13/1128* (2013.01)

(58) Field of Classification Search
CPC ........ H03M 13/1108; H03M 13/1128; H03M 13/3746; H03M 13/015
See application file for complete search history.

(56) References Cited

U.S. PATENT DOCUMENTS

| | | | |
|---|---|---|---|
| 8,347,195 B1 | 1/2013 | Varnica et al. | |
| 8,887,032 B1 | 11/2014 | Varnica et al. | |
| 9,564,922 B1 | 2/2017 | Graumann et al. | |
| 9,614,547 B2 | 4/2017 | Fainzilber et al. | |
| 10,089,177 B2 * | 10/2018 | Bazarsky | G06F 11/1076 |
| 10,303,364 B2 | 5/2019 | Bhatia et al. | |
| 10,374,639 B2 * | 8/2019 | Bazarsky | H03M 13/1108 |
| 10,707,899 B2 * | 7/2020 | Bhatia | G11C 29/42 |
| 10,715,182 B2 * | 7/2020 | Chen | H03M 13/45 |
| 10,761,927 B2 * | 9/2020 | Lu | H03M 13/3738 |
| 10,797,728 B1 * | 10/2020 | Varnica | H03M 13/3707 |
| 11,018,695 B1 * | 5/2021 | Zhang | H03M 13/1108 |
| 11,146,290 B1 | 10/2021 | Xiong et al. | |
| 11,184,024 B2 * | 11/2021 | Xiong | G06F 11/1012 |
| 11,190,212 B1 * | 11/2021 | Asadi | H03M 13/1137 |
| 2004/0039769 A1 | 2/2004 | Orio | |
| 2010/0169746 A1 | 7/2010 | Karabed et al. | |
| 2014/0164879 A1 | 6/2014 | Tam | |
| 2016/0266971 A1 | 9/2016 | Torii et al. | |

(Continued)

OTHER PUBLICATIONS

Final Office Acion, U.S. Appl. No. 17/223,804, dated Jul. 22, 2022, 14 pages.

(Continued)

*Primary Examiner* — Esaw T Abraham
(74) *Attorney, Agent, or Firm* — NICHOLSON DE VOS WEBSTER & ELLIOTT LLP

(57) ABSTRACT

Methods, systems, and apparatuses detect and mitigate a stall condition in an iterative decoder. A codeword is received and one or more of the plurality of bits in the codeword are flipped by a bit flipping decoder in each of a plurality of error correction iterations using a first plurality of bit flipping rules. In response to detecting a stall condition in the plurality of error correction iterations, a second plurality of bit flipping rules is selected. In each of one or more subsequent error correction iterations, the bit flipping decoder flips one or more of the plurality of bits in the codeword using the second plurality of bit flipping rules. The second plurality of bit flipping rules differs from the first plurality of bit flipping rules.

18 Claims, 8 Drawing Sheets

(56) References Cited

U.S. PATENT DOCUMENTS

| | | |
|---|---|---|
| 2017/0117925 A1 | 4/2017 | Achtenberg et al. |
| 2018/0115325 A1* | 4/2018 | Blaettler et al. |
| 2018/0175889 A1* | 6/2018 | Bazarsky .......... H03M 13/6325 |
| 2019/0056991 A1 | 2/2019 | Kim |
| 2019/0068219 A1 | 2/2019 | Bhatia et al. |
| 2021/0036716 A1 | 2/2021 | Zhang et al. |
| 2021/0175900 A1 | 6/2021 | Kuo |

OTHER PUBLICATIONS

Final Office Action, U.S. Appl. No. 17/223,804, dated Dec. 23, 2022, 12 pages.
Non-Final Office Action, U.S. Appl. No. 17/223,804, dated May 26, 2022, 13 pages.
Non-Final Office Action, U.S. Appl. No. 17/223,804, dated Oct. 19, 2022, 12 pages.
Non-Final Office Action, U.S. Appl. No. 17/890,962, dated Jun. 15, 2023, 24 pages.
Notice of Allowance, U.S. Appl. No. 17/223,804, dated Feb. 28, 2023, 6 pages.
Non-Final Office Action, U.S. Appl. No. 17/223,910, dated Mar. 11, 2022, 15 pages.
Non-Final Office Action, U.S. Appl. No. 17/889,495, dated Feb. 13, 2023, 23 pages.
Notice of Allowance, U.S. Appl. No. 17/899,495, dated Mar. 15, 2023, 24 pages.
Notice of Allowance, U.S. Appl. No. 17/223,910, dated Jun. 10, 2022, 16 pages.
Non-Final Office Action, U.S. Appl. No. 17/890,978, dated Sep. 14, 2023, 9 pages.

* cited by examiner

FIG. 3

Table 330A
For structures
200A and 200C

| Bit | Correct bit value | Bit read from memory | Current State of bit in 200A/200C | Channel Information | Energy Function in 200A/200C |
|---|---|---|---|---|---|
| 1 | 0 | 1 | 0 | -1 | 2-1-1=0 |
| 2 | 0 | 1 | 0 | -1 | 2-1-1=0 |
| 3 | 0 | 1 | 0 | -1 | 2-1-1=0 |
| 4 | 0 | 1 | 1 | 1 | 2-1+1=2 |
| 5 | 0 | 1 | 1 | 1 | 2-1+1=2 |
| 6 | 0 | 1 | 1 | 1 | 2-1+1=2 |

Table 330B
for Structure 200B

| Bit | Correct bit value | Bit read from memory | Current State of bit in 200B | Channel Information | Energy Function in 200B |
|---|---|---|---|---|---|
| 1 | 0 | 1 | 1 | 1 | 1-2+1=0 |
| 2 | 0 | 1 | 1 | 1 | 1-2+1=0 |
| 3 | 0 | 1 | 1 | 1 | 1-2+1=0 |
| 4 | 0 | 1 | 1 | 1 | 3+1=4 |
| 5 | 0 | 1 | 1 | 1 | 3+1=4 |
| 6 | 0 | 1 | 1 | 1 | 3+1=4 |

| Iteration | Order bit locations are evaluated for flipping | | | | | |
|---|---|---|---|---|---|---|
| 0 | 0 | 1 | 2 | 3 | 4 | 5 |
| 1 | 0 | 1 | 2 | 3 | 4 | 5 |
| 2 | 0 | 1 | 2 | 3 | 4 | 5 |
| 3 | 0 | 1 | 2 | 3 | 4 | 5 |

410

| Iteration | Order bit locations are evaluated for flipping | | | | | |
|---|---|---|---|---|---|---|
| 0 | 0 | 1 | 2 | 3 | 4 | 5 |
| 1 | 5 | 0 | 1 | 2 | 3 | 4 |
| 2 | 4 | 5 | 0 | 1 | 2 | 3 |
| 3 | 3 | 4 | 5 | 0 | 1 | 2 |

415

| Iteration | Order bit locations are evaluated for flipping | | | | | |
|---|---|---|---|---|---|---|
| 0 | 5 | 0 | 1 | 2 | 3 | 4 |
| 1 | 0 | 1 | 2 | 3 | 4 | 5 |
| 2 | 3 | 4 | 5 | 0 | 1 | 2 |
| 3 | 2 | 3 | 4 | 5 | 0 | 1 |

FIG. 5

| Iteration | Syndrome Iteration Start | Syndrome Iteration End |
|---|---|---|
| 0 | 604 | 300 |
| 1 | 300 | 76 |
| 2 | 76 | 46 |
| 3 | 46 | 38 |
| 4 | 38 | 36 |
| 5 | 36 | 34 |
| 6 | 34 | 32 |
| 7 | 32 | 30 |
| 8 | 30 | 30 |
| 9 | 30 | 50 |
| 10 | 50 | 24 |
| 11 | 24 | 12 |
| 12 | 12 | 12 |
| 13 | 12 | 28 |
| 14 | 28 | 18 |
| 15 | 18 | 12 |
| 16 | 12 | 12 |
| 17 | 12 | 28 |
| 18 | 28 | 18 |
| 19 | 18 | 12 |
| 20 | 12 | 6 |

STALL PATTERN 502

ERROR CORRECTOR 113

STALL MITIGATION IN ITERATIVE DECODERS

TECHNICAL FIELD

The present disclosure generally relates to error correction in memory subsystems, and more specifically, relates to methods and systems of adjusting a set of bit flipping rules in response to the detection of a stall condition in an iterative decoder.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 illustrates tables of exemplary values of bits of the codeword structure can take over multiple iterations of the error correction in accordance with some embodiments.

FIG. 4 illustrates tables of exemplary dynamic bit location orders for mitigating a stall condition in an iterative decoder in accordance with some embodiments.

FIG. 5 illustrates a block diagram of an exemplary table including a stall pattern that is detected during error correction of a codeword in accordance with some embodiments.

DETAILED DESCRIPTION

Figure 1:
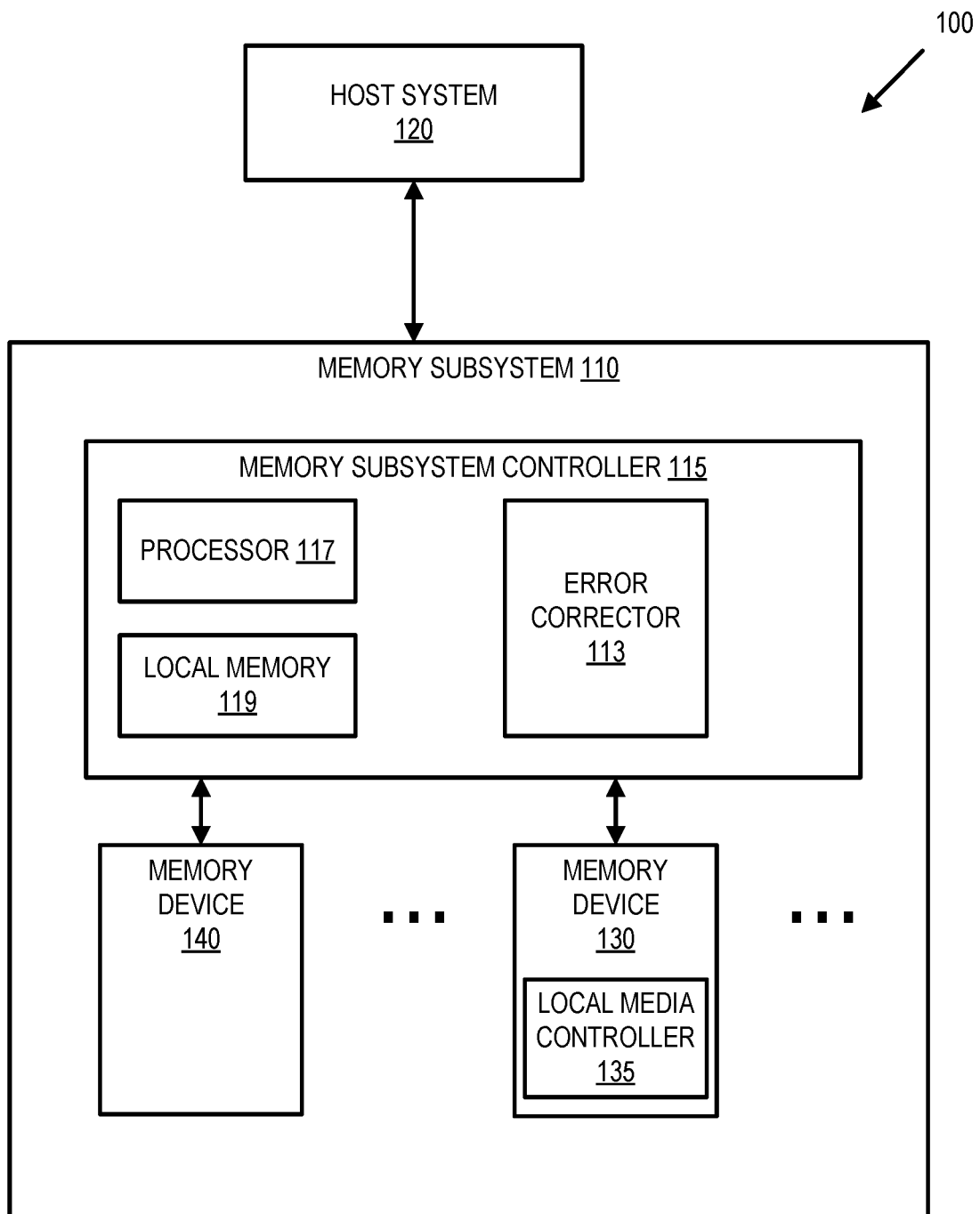
FIG. 1 illustrates an example computing system that includes a memory subsystem in accordance with some embodiments of the present disclosure.

Aspects of the present disclosure are directed to detecting and mitigating a stall condition in iterative decoders of a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to channel capacity. The MinSum algorithm (MSA), which is a simplified version of a belief propagation algorithm, can be used for decoding LDPC codes. MSA-based decoders, however, use a relatively high amount of energy per bit (e.g., pico-Joule per bit) for decoding codewords. As a result, MSA-based decoders are not well suited for energy conscious applications, such as mobile applications.

A Bit Flipping (BF) decoder iteratively determines an energy function for each bit in a codeword and flips the bit when the energy function satisfies a bit flipping threshold. BF decoders use less energy per bit at the expense of providing a lower error correction capability when compared to the error correction capability of MSA-based decoders. Lower error correction capability is an obstacle to the deployment of BF decoders for replacing MSA-based decoders. Additionally, a BF decoder can get stuck in a stall condition, e.g., in which a pattern of the count of unsatisfied parities repeats and additional iterations of the decoder do not enable the BF decoder to further reduce the count of unsatisfied parities and complete the decoding process. Such stall conditions affect the Quality of Service (QoS) and latency of the memory subsystem. A BF decoder unable to exit a stall condition can trigger escalated error handling operations, even when the raw bit error rate (RBER) is low, which results in worse QoS and higher latency.

Aspects of the present disclosure address the above and other deficiencies by detecting a stall condition in the decoding iterations of a BF decoder and modifying the bit flipping rules to exit the stall condition. For example, the memory subsystem can detect a stall condition upon detecting a repetition in syndromes, reaching or exceeding a threshold iteration count during which the number of parity violations of a codeword is less than or equal to a parity violation threshold, or a combination the two (e.g., detecting a repetition in response to reaching or exceeding an iteration count threshold when the number of parity violations of a codeword is less than or equal to a parity violation threshold). In response to detecting a stall condition, the memory subsystem modifies a set of bit flipping rules for the BF decoder. By modifying the use of channel information in determining a bit's energy function, an order the plurality of bits of the codeword are iteratively evaluated for flipping, and/or the bit flipping threshold, the memory subsystem improves the decoder's ability to exit the stall condition and, accordingly, the performance of the memory subsystem.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes error corrector 113 that detects and mitigates stall conditions. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 120, an application, or an operating system.

In some implementations, the error corrector 113 is operative to encode and decode data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120 and store the data and parity bits as codewords in the memory device 130. The error corrector 113 can be further operative to decode data stored in the memory device 130 to identify and correct erroneous bits of the data before transmitting corrected data to the host system 120. Although illustrated as a single component that can perform encoding and decoding of data, the error corrector 113 can be provided as separate components. In some embodiments, the error corrector 113 encodes data according to a low-density parity-check (LDPC) code. The error corrector 113 decodes the codewords stored in the memory device 130 based on a BF decoder. As described below, the error corrector 113 detects and mitigates stall conditions in the decoding iterations by updating a dynamic stop condition for the BF decoder. Further details with regard to the operations of the error corrector 113 are described below.

Figure 2:
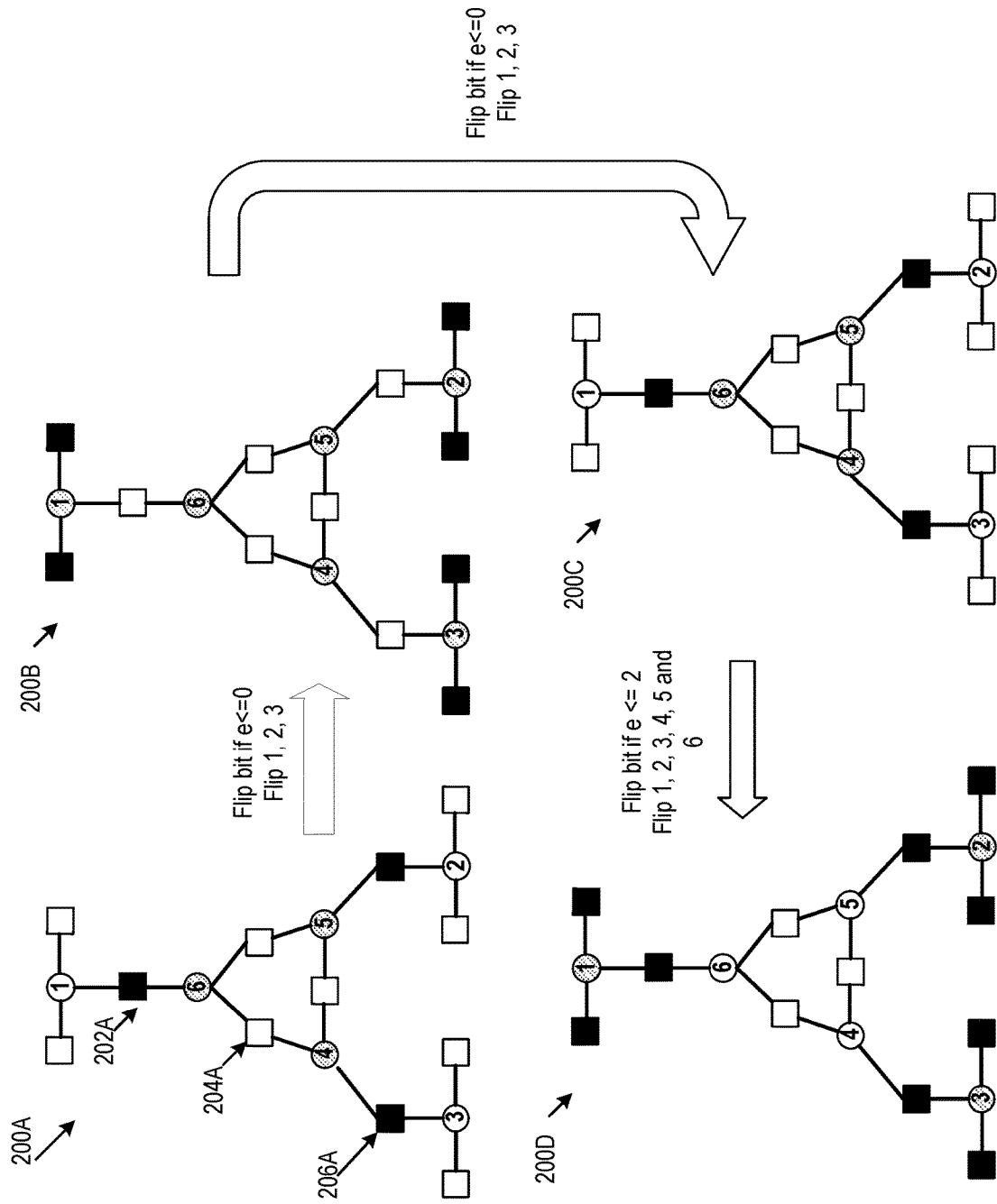
FIG. 2 illustrates a block diagram of an exemplary codeword structure that is error corrected based on the operations of an error corrector in accordance with some embodiments of the present disclosure.

FIG. 2 illustrates a block diagram of an exemplary code structure that is error corrected based on the operations of the error corrector 113, in accordance with some embodiments of the present disclosure. The code structure includes data bits and parity checks. The circles, e.g., circles 1, 2, 3, 4, 5 and 6, represent the data bits and the squares, e.g., squares 202A, 204A, 206A, etc., represent parity checks. A shaded circle represents a bit in error, e.g., circles 4, 5, and 6 in state 200A, and a black square represents a parity violation (i.e., a failed or unsatisfied parity check), whereas an unshaded circle represents a correct bit, e.g., circles 1, 2, 3 in state 200A, and an unshaded square represents a satisfied parity check, e.g., square 204A.

The code structure is a simplified representation of a portion of a codeword and is illustrated as having multiple states, e.g., states 200A, 200B, 200C, and 200D. The states of the structure include an initial state of the illustrated bits and parity checks and states of the bits and parity checks that result from iterations of the error corrector 113 flipping bits. The states of the code structure represent a stall condition, also referred to as a trapping set or stopping set, that can cause a failure in traditional BF decoders (i.e., causes a traditional BF decoder to oscillate indefinitely). Each of the error correction iterations illustrated in FIG. 2, including the remediation of a stall condition, is described in additional detail below.

The code structure states of FIG. 2 will be described in conjunction with the exemplary bit values of tables 330A-B from FIG. 3. FIG. 3 illustrates tables of exemplary values that bits of the code structure states can take over multiple iterations of the error corrector 113, in accordance with some embodiments. The tables 330A and 330B include column 331, column 332, and column 333 which include values that remain unchanged over the multiple iterations of the error corrector 113. Column 331 includes an identifier of the bits, 1, 2, 3, 4, 5, and 6. Column 332 includes the correct value of each bit. Column 333 includes the value of each bit as read from the memory device. Each of the tables 330A and 330B includes a column that includes the current value of the bit after the latest/previous iteration of the error correction, respectively columns 334A and 334B. Each of the tables 330A and 330B also includes a column that includes a channel information for the bit (indicating whether the current value matches the value of the bit read from memory), respectively columns 335A and 335B, and a column that includes an energy function value of the bit, respectively columns 336A and 336B.

An energy function assigns an energy or confidence level to each codeword bit. An energy function of a codeword bit can be considered an indication of reliability information for the codeword bit. In one embodiment, a higher energy function corresponds to a more reliable bit. An energy function of a codeword bit can be determined based on a count of parity violations per codeword bit (e.g., a higher number of parity violations is a sign of less reliable bit). The energy function can further be based on channel information. The channel information is determined based on a comparison of a current state of the bit to the state of the bit when read from a memory device. When the current state of the bit agrees with the state of the bit when read from the memory device (e.g., both bits set to a value of zero or both bits set to a value of one), the bit is considered to be more reliable than when the bit states do not match. BF decoders can flip least reliable bits first.

To correct the errors, an error corrector 113 ideally would flip bits 4, 5, and 6 which are in error. The correct bit values, however, are unknown to the error corrector 113. The error corrector 113 determines an energy function for each one of the bits (column 336A) and flips the bits according to the energy function and a bit flipping criterion. To determine the energy function for a bit, the error corrector 113 can determine channel information for a bit (column 335A), the number of satisfied parities for a bit, and/or the number of failed parities for the bit. In some embodiments, the error corrector 113 determines a channel information for a bit according to the non-limiting example of equation (1):

$$\text{Channel information(bit)}=1-2*(\text{CurrentState(bit)}\text{XOR StateReadFromMemory(bit)}) \quad (1)$$

CurrentState(bit) is the state of the bit that results from the latest iteration of the error corrector 113 (column 334A) and the StateReadFromMemory(bit) is the state of the bit as read from memory (column 333A). According to equation (1), the channel information is 1 when the current state of the bit is equal to the state of the bit as read from memory, and the channel information is −1 when the current state of the bit is different from the state of the bit as read from memory.

The error corrector 113 determines the energy function based at least in part on the determined channel information. In a non-limiting example, an energy function can be determined according to equation (2):

$$e(\text{bit})=\text{NumberSatisfiedParities(bit)}-\text{NumberFailedParities(bit)}+\text{Channel information(bit)}) \quad (2)$$

In other embodiments, the energy function is based on the number of satisfied parities for a bit or the number of failed parities for the bit while omitting channel information.

In the code structure state 200A, the bits 4, 5, and 6 are in error and bits 1, 2, and 3 are correct. Additionally, each of the bits 4, 5, and 6 is identical to its respective bit in the codeword as read from memory. There is a channel match between the current state of the bit and the bit read from memory for circles 4, 5, and 6. Bits 1, 2, and 3 are not in error but the bit read from memory disagrees with the current state of the bit, i.e., Bits 1, 2, and 3 were read in error from the memory device. There is a channel mismatch between the current state of the bit and the bit read from memory for bits 1, 2, and 3. As a result, an initial bit flipping criterion (e.g., e(bit) is less than or equal to 0) results in flipping bits 1, 2, 3 and the state of the code structure moves from code structure state 200A to code structure state 200B. Because bits 1, 2, and 3 are correct and bits 4, 5, and 6 are in error, these are false flips.

In a non-limiting example, the error corrector 113 determines the energy function for the bits 1, 2, 3, 4, 5, and 6 based on equation (2) and the values illustrated in FIG. 3. In code structure state 200A, each of the bits 1, 2, 3 have the same number of failed parities, 1, and the same number of satisfied parities, 2. Further, the channel information for each one of the bits 1, 2, and 3 is −1 as the current state of the bit disagrees with the state of the bit as read from memory. The energy function for each one of the bits of circles 1, 2, and 3 is e(1:3)=2−1−1=0 (column 336A). In code structure state 200A, the bits 4, 5, and 6 have the same number of satisfied parities, 2, and the same number of failed parities, 1 failed parity. The channel information for bits 4, 5, and 6 is 1 as the current state of the bit agrees with the state of the bit as read from memory. The energy function for bits 4, 5, and 6 is e(4:6)=2−1+1=2. Thus, while bits 4, 5, 6 are in error in structure state 200A, the energy function of bits 1, 2, and 3 is lower than the energy function of bits 4, 5, and 6 indicating that bits 1, 2, and 3 are less reliable than bits 4, 5, and 6.

The error corrector 113 flips codeword bits 1, 2, and 3, which are not in error, based on an initial bit flipping criterion. The bit flipping criterion is when the energy function satisfies a bit flipping threshold. For example, the error corrector 113 flips a bit when the energy function of the bit is less than or equal to the bit flipping threshold. According to the energy function and initial bit flipping criterion, the bits 4, 5, and 6, are determined to be more reliable than bits 1, 2, and 3, even though bits 4, 5, and 6 are in error and bits 1, 2, and 3 are correct. The result of the error corrector's iteration is code structure state 200B.

During a subsequent iteration, the error corrector 113 determines the energy function for bits 1, 2, 3, 4, 5 and 6, (e.g., column 336B where e(1:3)=1−2+1=0; e(4:6)=3+1=4). Based on these energy functions and the initial bit flipping criterion (e.g., bit flipping threshold of 0), the error corrector 113 flips bits 1, 2, and 3 again instead of flipping bits 4, 5, and 6, because the energy function for bits 1, 2, and 3 continues to indicate that bits 1, 2, and 3 are less reliable than bits 4, 5, and 6 (e.g., e(1:3) is less than or equal to the bit flipping threshold, whereas e(4:6) is greater than the bit flipping threshold). Structure state 200C is obtained from this iteration, where structure state 200C is identical to structure state 200A and can cause the error corrector 113 to oscillate, repeating the decoding pattern that results in structure states 200B-200C (i.e., a stall condition).

The error corrector 113 detects a stall condition (as described further below) and selects a different set of bit flipping rules or otherwise modifies the set of bit flipping rules for one or more iterations. In one embodiment, the error corrector 113 modifies (1) the use of channel information in determining a bit's energy function (e.g., modifying the impact of channel information or omitting channel information), (2) an order the plurality of bits of the codeword are iteratively evaluated for flipping, and/or (3) the bit flipping threshold. The modification of each is described in additional detail below. For example, reducing the impact of channel information can include dividing one or both of the channel information values. In one embodiment, initial channel information values of 1 and −1 can be reduced to 0.5 and −0.5. As another example, the error corrector 113 modifies the bit flipping threshold value to trigger the flipping of more bits (e.g., decreasing the reliability of bits in the codeword). For example, the error corrector 113 modifies the bit flipping criterion by increasing the bit flipping threshold to 2 such that a bit with an energy function that is less than or equal to 2 is flipped.

The updated bit flipping criterion (e.g., modified channel information values, omitted channel information values, and/or modified bit flipping threshold) causes the bits 1, 2, 3, 4, 5 and 6 to be flipped, resulting in updated the code structure state 200D. Thus, in this iteration (when the error corrector 113 is operating on code structure state 200C), while the energy function of the bits has not changed, the modification of the bit flipping criterion causes bits 1, 2, 3, 4, 5 and 6 to be flipped as they all satisfy the bit flipping criterion (e(1:3) is less than 2, e(4:6) is equal to 2). The iteration of the error corrector 113 results in the code structure state 200D. In other words, relaxing the bit flipping criteria for one or multiple iterations when the decoder is in stall condition helps the decoder to get out of the stall condition and increase the likelihood of the error corrector 113 successfully decoding the codeword. As described above, increasing the maximum iteration count allows the error corrector 113 a greater opportunity to exit the stall condition using modified bit flipping rules. As a result, the error corrector 113 reduces the likelihood of an uncorrectable error or triggering a more resource intensive error correction process.

Similarly, the error corrector 113 can use a different order in which the bit flipping decoder evaluates bits of the codeword for flipping. For example, the error corrector 113 can select a different starting bit location for each of one more iterations of evaluating each bit of a codeword for flipping. The dynamic, non-deterministic, or random selection of a starting bit location allows the bit flipping decoding process to flip bits in a different order between one iteration and the next. Flipping one or more bits first in a current bit flipping iteration (that were not flipped first in a previous iteration) can alter the energy function of one more other bits in the codeword, leading to a different outcome of flipped bits in the decoding process (when compared to the previous iteration). As a result, the error corrector 113 improves the likelihood of exiting the stall condition and decoding the codeword. Different starting bit locations are described in additional detail below with reference to FIG. 4.

In one embodiment, the error corrector 113 also increases a maximum iteration count or a maximum decoding time in response to detecting a stall condition (i.e., updating the stopping criterion). While an increased maximum stop condition corresponds to additional time and energy consumed by the BF decoding, it also provides the error corrector 113 an opportunity to exit the stall condition. If successful, even with additional iterations, the error corrector 113 can perform error correction at a lower resource cost than using an error correction scheme that has a greater error correction capability than a BF decoder. Additionally, stall conditions are low probability events, so the error corrector 113 can use a default stop condition that is set lower than, e.g., a worst-case scenario, and reserve a greater maximum stop condition for instances in which a stall condition is detected.

FIG. 4 illustrates tables of exemplary dynamic bit location orders for mitigating a stall condition in an iterative decoder in accordance with some embodiments. For example, the error corrector 113 can use a static bit location as a starting point for each iteration prior to detecting a stall condition, as illustrated in table 405. In each exemplary iteration of table 405, the error corrector 113 applies a bit flipping decoder to bit location 0 first and continues to evaluate each of the other bit locations in incremental order. In response to detecting a stall condition, the error corrector 113 can select a dynamic bit location starting point for each iteration, as illustrated in table 410 and in table 415. Some embodiments use other dynamic, non-deterministic or random starting bit locations than those illustrated.

For example, table 410 provides an example of a dynamic starting bit position selected by decreasing the prior iteration starting bit location by a bit position offset value of one for each of error correction iterations 0-3. The error corrector 113 proceeds from the starting bit location to each subsequent bit location in order (and wrapping around to the beginning of the codeword when starting at any bit location other than the beginning of the codeword). Iteration 0 starts by evaluating bit location 0 for flipping and then proceeds to evaluate each of locations 1-5 in order. Iteration 1 decrements the bit starting location from iteration 0 to start with bit location 5, evaluates bit location 5 for flipping, and then proceeds to evaluate each of locations 0-4 in order. Iterations 2 and 3 proceed in a similar fashion. The error corrector 113 can increase the bit location starting point by an offset, use other positive or negative values for the bit position offset value, etc.

As another example, table 415 provides an example using a random starting bit location. Again, the error corrector 113 proceeds from the starting bit location to each subsequent bit location in order (and wrapping around to the beginning of the codeword when starting at any bit location other than the beginning of the codeword). Iteration 0 starts by evaluating randomly selected bit location 5 and then proceeds to evaluate each of locations 0-4 in order. Iteration starts by evaluating randomly selected bit location 0 and then proceeds to evaluate each of locations 1-5 in order. Iterations 2 and 3 proceed in a similar fashion.

FIG. 5 illustrates a block diagram of an exemplary table 500 including a stall pattern that is detected during error correction of a codeword, in accordance with some embodiments. The error corrector 113 decodes a codeword, attempting to correct errors for multiple iterations. As an example, the table 500 shows syndromes at the start and end of iterations of the error corrector 113. A syndrome indicates a number of parity violations in a codeword. At the initial iteration, 0, the syndrome at the start of the iteration is 604 and the syndrome at the end of the iteration is 300. The error corrector 113 performs a subsequent error correction iteration, iteration 1. At iteration 1, a syndrome iteration start is 300 and a syndrome iteration end is 76. In this example, the BF decoder of the error corrector 113 starts oscillating (i.e., enters a stall condition) at iteration 12 and the period of oscillation is 4. The stall pattern 502 can be repeated a second time (from iteration 16 to iteration 19). Upon detecting the stall condition, the error corrector 113 updates one or more bit flipping rules, resulting in breaking out of the stall condition at the end of iteration 20. The detection of a stall condition and update to the bit flipping rule(s) are described in further detail below.

Figure 6:
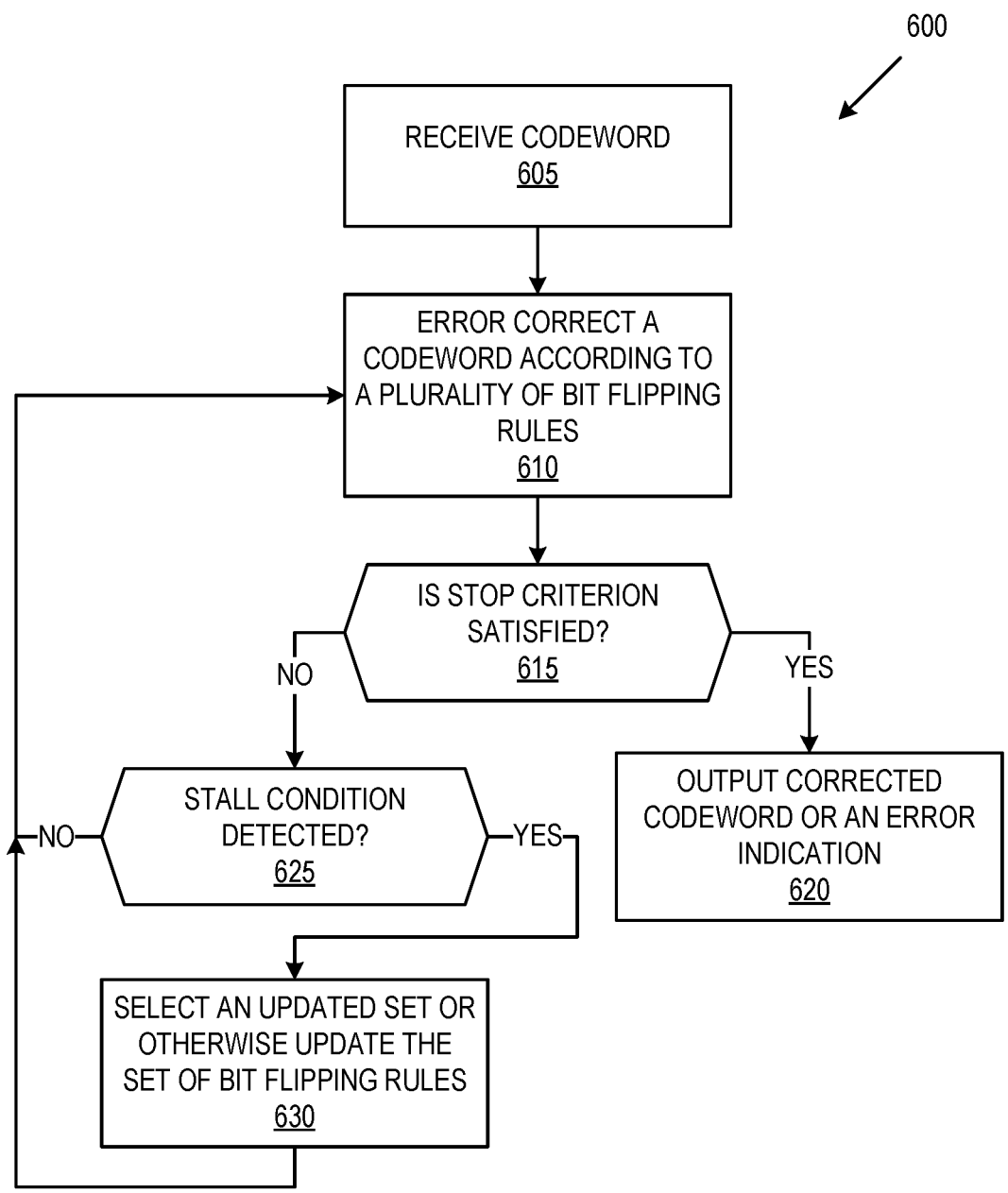
FIG. 6 is a flow diagram of an example method to detect and mitigate a stall condition in iterative decoders in accordance with some embodiments of the present disclosure.

FIG. 6 is a flow diagram of an example method 600 to detect and mitigate a stall condition in a decoder of a memory subsystem in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. The operations of the method 600 will be described with reference to the stall pattern of FIG. 5 as an exemplary stall pattern that can occur during error correction of a codeword. The illustrated embodiments should be understood only as examples, other stall patterns can occur.

At operation 605, the processing device receives a codeword from a memory device, e.g., memory device 130 or memory device 140. In some embodiments, the codeword is received as a result of the execution of a read request from a host system 120. The codeword includes a combination of data bits and parity check bits. For example, the parity check bits are stored in the memory device along with the data bits.

At operation 610, the processing device iteratively decodes the codeword. For example, the error corrector 113 includes or uses a bit flipping decoder that performs an iteration of the decoding process, flipping bits within the codeword based on an initial set of bit flipping rules. The processing device performs an initial error correction iteration on the codeword to obtain an initial corrected codeword. During an iteration, the processing device determines locations of potentially erroneous bits in the codeword and flips one or more of these bits to obtain an updated codeword (e.g., using an energy function and bit flipping criterion, as described above). For example, the error corrector 113 flips bits in the codeword during iteration 0 of table 500.

During the initial iteration, the processing device corrects errors of the codeword according to initial bit flipping rules. As discussed above, the initial set of bit flipping rules includes at least one of or a combination of two or more of: a bit flipping threshold, channel information values or weighting of channel information values, a bit flipping order, and a stopping criterion. For example, the processing device flips one or more bits for the codeword that satisfy the initial bit flipping threshold as described above. As described below, the processing device can perform several iterations based on the initial bit flipping criterion. Subsequent iterations can correct errors based on the updated codeword from a previous iteration. Referring to table 500, the processing device can perform iterations 0 to 15 based on the initial bit flipping criterion.

At operation 615, the processing device determines whether a stop condition/criterion is satisfied. A stop criterion can include an indication that no errors are detected for the codeword. In some embodiments, the stop criterion can include a null syndrome indicating that the codeword no longer include erroneous bits. In some embodiments, the stop criterion can include a maximum number of iterations (i.e., the maximum iteration count) or a maximum amount of time. For example, the processing device is operative to perform the maximum number of iterations (e.g., 30 iterations, 40 iterations, 100 iterations, etc.), and when this number of iterations is performed, the resulting codeword is output, regardless of whether the codeword still includes erroneous bits or not. When the stop criterion is satisfied, the method 600 proceeds to operation 620. When the stop criterion is not satisfied, the method 600 proceeds to operation 625.

At operation 620, the processing device outputs the corrected codeword or an indication of failure if the processing device was unable to decode the codeword. For example, the error corrector 113 can transmit the corrected codeword to the host 120. In another example, an indication of failure can trigger a different error correction process or the transmission of an error message to the host 120.

At operation 625, the processing device determines if a stall condition is present in the performed iterations. In some embodiments, the processing device detects a stall condition by monitoring syndromes that result from the error correction of the codeword in the multiple iterations, and detecting a stall pattern, e.g., stall pattern 502, in the syndromes that result from the error correction of the codeword in consecutive iterations from the multiple iterations. For example, the error corrector 113 can store multiple consecutive syndromes generated during iterations of error correction of a codeword and compare successive sets of these syndromes to identify a stall pattern that repeats over multiple sets of iterations. The error corrector 113 can identify the stall pattern 502 as a repeating pattern between iterations 12-15 and iterations 16-19.

In some embodiments, the processing device can detect the stall condition in multiple iterations by hashing multiple syndromes that result from the error correction of the codeword in the multiple iterations and comparing the hash value with a hash value resulting from hashing other syndromes resulting from the error correction of the codeword in other iterations. For example, the error corrector 113 can generate a hash value from the syndromes of iterations 12-15, and another hash value from the syndromes of iterations 16-19. The error corrector 113 compares the two hash values to determine that the iterations 12-15 and the iterations 16-19 have a similar pattern that is repeating.

In another embodiment, the processing device detects the stall condition by determining an iteration count threshold is satisfied and a parity violation count threshold is satisfied. A BF decoder usually corrects errors quickly and a current iteration count that does not trigger a stopping criterion but is equal to or greater than the iteration count threshold can indicate a potential stall condition. Additionally, a small number of parity violations at or above a threshold iteration count can also indicate a potential stall condition. For example, referring to table 500, the error corrector 113 can use an iteration count threshold of 19 iterations. In detecting the parity violation count threshold being satisfied (e.g., a syndrome less than or equal to 20 for table 500) when the iteration count threshold is also satisfied (e.g., a current iteration count of 19 or more iterations), the error corrector 113 determines that a stall condition is present.

In some embodiments, the processing device detects the stall condition using a combination of one or more thresholds and monitoring syndromes for a repeating pattern. For example, the error corrector 113 can store and compare groups of consecutive syndromes in response to determining an iteration count threshold is satisfied and/or an iteration count threshold and parity violation count threshold is satisfied.

In response to determining that a stall condition is not present, the method proceeds to operation 610 to perform another iteration of error correcting the codeword. The processing device continues to flip bits of the codeword based on the current bit flipping criterion as described above. Otherwise, in response to detecting a stall condition, the method 600 proceeds to operation 30.

At operation 630, the processing device selects an updated set of bit flipping rules or otherwise updates the set of bit flipping rules. In some embodiments, the error corrector 113 selects a single updated bit flipping rule (e.g., updates one of the multiple bit flipping rules). In some embodiments, the error corrector 113 selects multiple updated bit flipping rules (e.g., updates multiple bit flipping rules). For example, the error corrector 113 can increase or otherwise modify the maximum iteration count threshold used for detecting a stop criterion in response to detecting a stall condition. Similarly, the error corrector 113 can increase or otherwise modify a maximum decoding time threshold (i.e., the maximum time allotted to decoding the codeword).

In some embodiments, selecting an updated bit flipping rule or otherwise updating a bit flipping rule includes the processing device updating the bit flipping criterion to an updated bit flipping criterion for one or more iterations. In some embodiments, updating the bit flipping criterion can include reducing the impact channel information and/or an updating a bit flipping threshold value as described above. In some embodiments, updating the bit flipping criterion includes relaxing the flipping conditions, resulting in more bits flipped to enable the processing device to exit the stall condition.

In some embodiments, updating a bit flipping rule includes the processing device modifying an order in which bits are flipped for one or more iterations. For example, in using a random or other non-deterministic bit flipping order, the error corrector 113 can take advantage of the flipping of one or more bits altering the evaluation of parity violations for one or more other bits that may have otherwise been stuck in the stall pattern.

The method 600 proceeds to operation 610 to perform another iteration of error correcting the codeword. During this iteration, however, the processing device flips bits of the codeword using the updated bit flipping rule(s). In some embodiments, the updated bit flipping rules cause more bits to be flipped than when the initial bit flipping rules were used. For example, an updated bit flipping threshold can cause one or more bits that were previously determined to be reliable to be flipped. As another example, evaluating the bits in a different order can cause different bits to be flipped. The processing device can perform one or multiple iterations based on the updated bit flipping rules.

While the embodiments herein describe initial and updated bit flipping rules, in some embodiments, the bit flipping rules can be updated multiple times (e.g., multiple increases of a bit flipping threshold, an increase followed with a decrease of the threshold, etc.). In one embodiment, the processing device can use the updated bit flipping criterion for one or more iterations before reverting back to the initial bit flipping criterion or further updating the bit flipping criterion (e.g., a threshold that is less than the initial bit flipping threshold and/or less than the updated bit flipping threshold, a threshold that is greater than the initial bit flipping threshold and/or greater than the updated bit flipping threshold). In another embodiment, the processing device can use the updated bit flipping criterion for one or more iterations before detecting another stall condition and further updating the bit flipping criterion.

Figure 7:
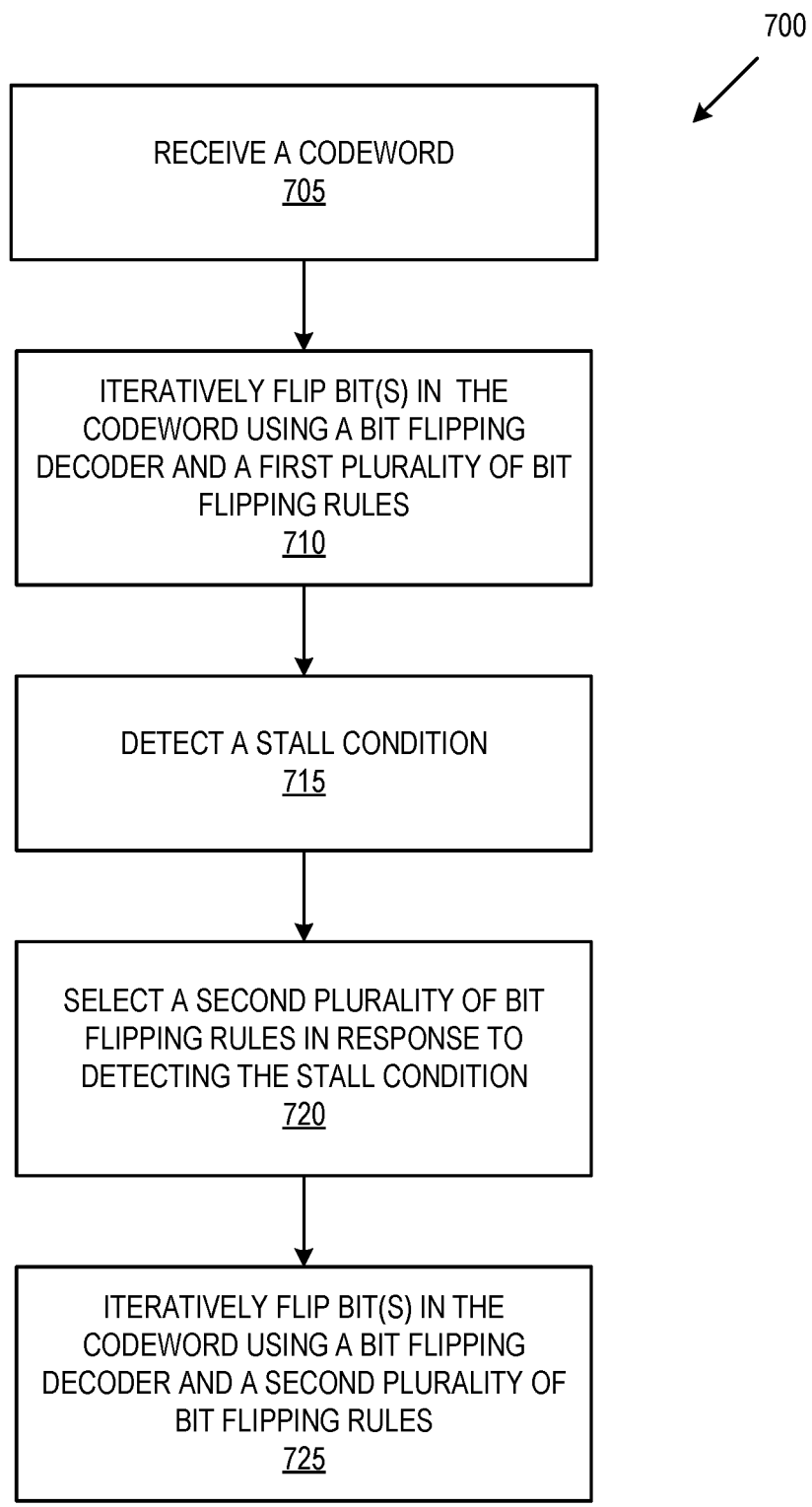
FIG. 7 is a flow diagram of another example method to detect and mitigate a stall condition in iterative decoders in accordance with some embodiments of the present disclosure.

FIG. 7 is a flow diagram of another example method 700 to detect and mitigate a stall condition in a decoder of a memory subsystem in accordance with some embodiments of the present disclosure. The method 700 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 700 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 705, the processing device receives a codeword from the memory device. For example, the error corrector 113 receives the codeword as a result of the execution of a read request from a host system 120 as described above with reference to operation 605.

At operation 710, the processing device iteratively error corrects the codeword in multiple iterations. For example, the error corrector 113 uses a bit flipping decoder to flip one or more bits of the codeword using a first set of bit flipping rules as described above with reference to operation 610.

At operation 715, the processing device detects a stall condition is present in the iterations. For example, the error corrector 113 detects a stall condition as described above with reference to operation 625.

At operation 720, the processing device selects a second set of bit flipping rules in response to detecting the stall condition. For example, the error corrector 113 selects an updated set of bit flipping rules or otherwise updates the set of bit flipping rules as described above with reference to operation 630.

At operation 725, the processing device iteratively error corrects the codeword using the second set of bit flipping rules for one or more subsequent iterations. For example, the error corrector 113 uses a bit flipping decoder to flip one or more bits of the codeword using the second set of bit flipping rules as described above with reference to operation 610.

Figure 8:
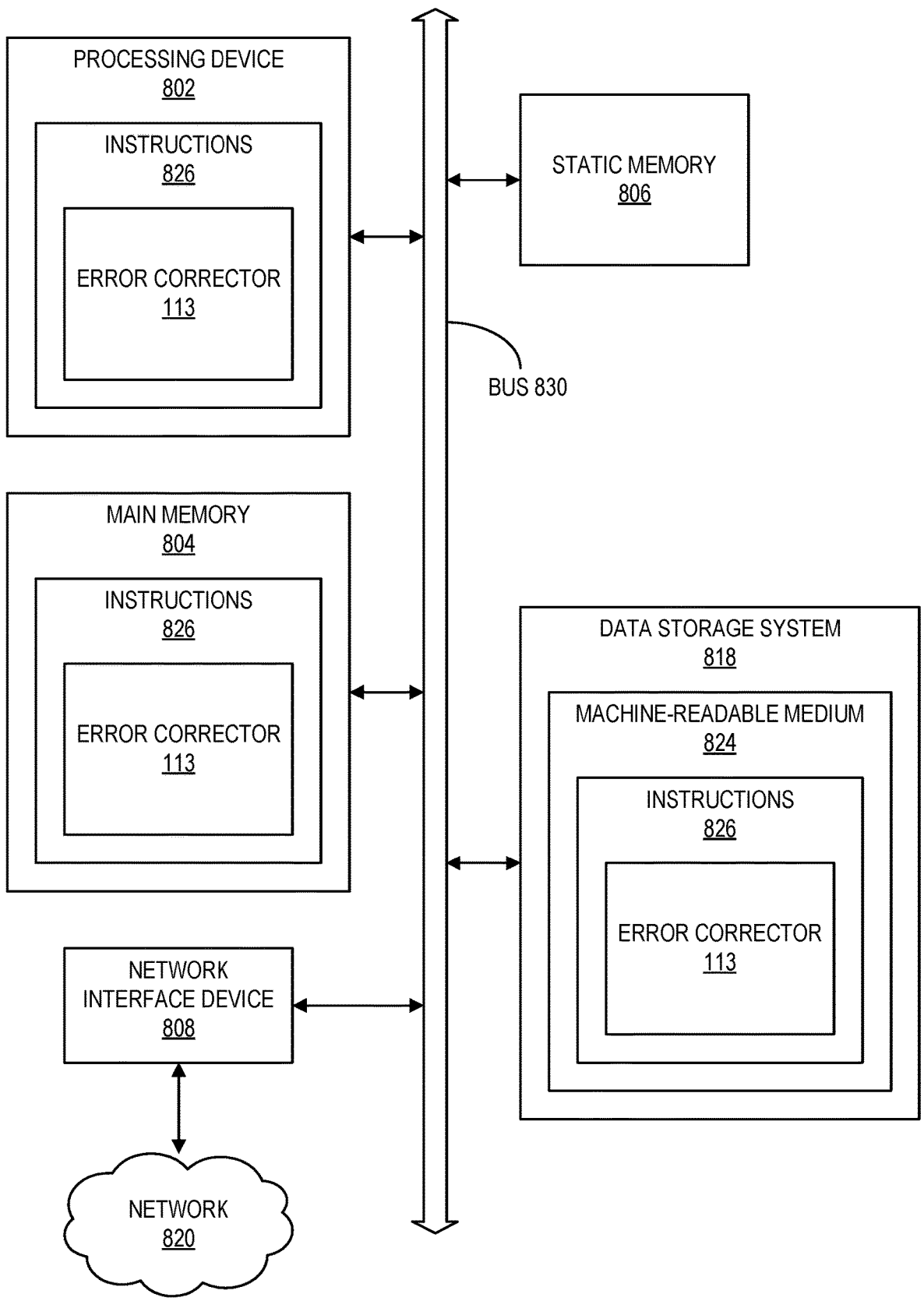
FIG. 8 is a block diagram of an example computer system in which embodiments of the present disclosure can operate.

FIG. 8 illustrates an example machine of a computer system 800 within which a set of instructions, for causing the machine to perform any one or more of the methodologies discussed herein, can be executed. In some embodiments, the computer system 800 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a data storage system 818, which communicate with each other via a bus 830.

Processing device 802 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 can also be one or more special-purpose processing devices such as an application specific integrated circuit (ASIC), a field programmable gate array (FPGA), a digital signal processor (DSP), network processor, or the like. The processing device 802 is configured to execute instructions 826 for performing the operations and steps discussed herein. The computer system 800 can further include a network interface device 808 to communicate over the network 820.

The data storage system 818 can include a machine-readable storage medium 824 (also known as a computer-readable medium) on which is stored one or more sets of instructions 826 or software embodying any one or more of the methodologies or functions described herein. The instructions 826 can also reside, completely or at least partially, within the main memory 804 and/or within the processing device 802 during execution thereof by the computer system 800, the main memory 804 and the processing device 802 also constituting machine-readable storage media. The machine-readable storage medium 824, data storage system 818, and/or main memory 804 can correspond to the memory subsystem 110 of FIG. 1.

In one embodiment, the instructions 826 include instructions to implement functionality corresponding to an error corrector (e.g., the error corrector 113 of FIG. 1). While the machine-readable storage medium 824 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 600 and 700 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method comprising:
   receiving a codeword from a memory device, the codeword including a plurality of bits;
   flipping, by a bit flipping decoder using a first plurality of bit flipping rules, one or more of the plurality of bits in the codeword in each of a plurality of error correction iterations responsive to the one or more of the plurality of bits in the codeword satisfying the first plurality of bit flipping rules;

detecting a stall condition in the plurality of error correction iterations;

selecting a second plurality of bit flipping rules in response to detecting the stall condition; and flipping, by the bit flipping decoder using the second plurality of bit flipping rules, one or more of the plurality of bits in the codeword in each of one or more subsequent error correction iterations responsive to the one or more of the plurality of bits in the codeword satisfying the first plurality of bit flipping rules, wherein the second plurality of bit flipping rules differs from the first plurality of bit flipping rules in two or more of:

use of channel information, an order the bit flipping decoder evaluates the plurality of bits of the codeword for flipping, and a bit flipping threshold, wherein the bit flipping threshold is compared against an energy function of each of the plurality of bits of the codeword in determining which bits to flip.

2. The method of claim 1, wherein a use of channel information in the second plurality of bit flipping rules includes, relative to the use of channel information in the first plurality of bit flipping rules, reducing an impact of channel information values in determining an energy function of each bit or omitting channel information values in determining the energy function of each bit.

3. The method of claim 1, wherein an order the bit flipping decoder evaluates the plurality of bits of the codeword for flipping in the second plurality of bit flipping rules is modified relative to the order the bit flipping decoder evaluates the plurality of bits of the codeword for flipping in the first plurality of bit flipping rules.

4. The method of claim 3, wherein the order the bit flipping decoder evaluates the plurality of bits of the codeword for flipping in the second plurality of bit flipping rules includes increasing a starting bit position by a bit position offset value for each of the one or more subsequent error correction iterations, decreasing the starting bit position by the bit position offset value for each of the one or more subsequent error correction iterations, or randomly selecting the starting bit position in the codeword for each of the one or more subsequent error correction iterations.

5. The method of claim 1, wherein detecting the stall condition comprises:

storing multiple consecutive syndromes generated by the plurality of error correction iterations; and identifying a repeated pattern in the multiple consecutive syndromes.

6. The method of claim 1, wherein detecting the stall condition comprises:

determining a count of the plurality of error correction iterations satisfies an iteration count threshold; and determining a count of parity violations satisfies a parity violation count threshold.

7. A non-transitory computer-readable storage medium comprising instructions that, when executed by a processing device, cause the processing device to:

receive a codeword from a memory device, the codeword including a plurality of bits;

flip, by a bit flipping decoder using a first plurality of bit flipping rules, one or more of the plurality of bits in the codeword in each of a plurality of error correction iterations responsive to the one or more of the plurality of bits in the codeword satisfying the first plurality of bit flipping rules;

detect a stall condition in the plurality of error correction iterations;

select a second plurality of bit flipping rules in response to detecting the stall condition; and flip, by the bit flipping decoder using the second plurality of bit flipping rules, one or more of the plurality of bits in the codeword in each of one or more subsequent error correction iterations responsive to the one or more of the plurality of bits in the codeword satisfying the first plurality of bit flipping rules, wherein the second plurality of bit flipping rules differs from the first plurality of bit flipping rules in two or more of:

use of channel information, an order the bit flipping decoder evaluates the plurality of bits of the codeword for flipping, and a bit flipping threshold, wherein the bit flipping threshold is compared against an energy function of each of the plurality of bits of the codeword in determining which bits to flip.

8. The non-transitory computer-readable storage medium of claim 7, wherein a use of channel information in the second plurality of bit flipping rules includes, relative to the use of channel information in the first plurality of bit flipping rules, reducing an impact of channel information values in determining an energy function of each bit or omitting channel information values in determining the energy function of each bit.

9. The non-transitory computer-readable storage medium of claim 7, wherein an order the bit flipping decoder evaluates the plurality of bits of the codeword for flipping in the second plurality of bit flipping rules is modified relative to the order the bit flipping decoder evaluates the plurality of bits of the codeword for flipping in the first plurality of bit flipping rules.

10. The non-transitory computer-readable storage medium of claim 9, wherein the order the bit flipping decoder evaluates the plurality of bits of the codeword for flipping in the second plurality of bit flipping rules includes increasing a starting bit position by a bit position offset value for each of the one or more subsequent error correction iterations, decreasing the starting bit position by the bit position offset value for each of the one or more subsequent error correction iterations, or randomly selecting the starting bit position in the codeword for each of the one or more subsequent error correction iterations.

11. The non-transitory computer-readable storage medium of claim 7, wherein detecting the stall condition includes causing the processing device to:

store multiple consecutive syndromes generated by the plurality of error correction iterations; and identify a repeated pattern in the multiple consecutive syndromes.

12. The non-transitory computer-readable storage medium of claim 7, wherein detecting the stall condition includes causing the processing device to:

determine a count of the plurality of error correction iterations satisfies an iteration count threshold; and determine a count of parity violations satisfies a parity violation count threshold.

13. A system comprising:

a memory device; and a processing device, operatively coupled with the memory device, to:

receive a codeword from a memory device, the codeword including a plurality of bits;

flip, by a bit flipping decoder using a first plurality of bit flipping rules, one or more of the plurality of bits in the codeword in each of a plurality of error correction iterations responsive to the one or more of the plurality of bits in the codeword satisfying the first plurality of bit flipping rules;

detect a stall condition in the plurality of error correction iterations;

select a second plurality of bit flipping rules in response to detecting the stall condition; and flip, by the bit flipping decoder using the second plurality of bit flipping rules, one or more of the plurality of bits in the codeword in each of one or more subsequent error correction iterations responsive to the one or more of the plurality of bits in the codeword satisfying the first plurality of bit flipping rules, wherein the second plurality of bit flipping rules differs from the first plurality of bit flipping rules in two or more of:

use of channel information, an order the bit flipping decoder evaluates the plurality of bits of the codeword for flipping, and a bit flipping threshold, wherein the bit flipping threshold is compared against an energy function of each of the plurality of bits of the codeword in determining which bits to flip.

14. The system of claim 13, wherein a use of channel information in the second plurality of bit flipping rules includes, relative to the use of channel information in the first plurality of bit flipping rules, reducing an impact of channel information values in determining the energy function of each bit or omitting channel information values in determining the energy function of each bit.

15. The system of claim 13, wherein an order the bit flipping decoder evaluates the plurality of bits of the codeword for flipping in the second plurality of bit flipping rules is modified relative to the order the bit flipping decoder evaluates the plurality of bits of the codeword for flipping in the first plurality of bit flipping rules.

16. The system of claim 15, wherein the order the bit flipping decoder evaluates the plurality of bits of the codeword for flipping in the second plurality of bit flipping rules includes increasing a starting bit position by a bit position offset value for each of the one or more subsequent error correction iterations, decreasing the starting bit position by the bit position offset value for each of the one or more subsequent error correction iterations, or randomly selecting the starting bit position in the codeword for each of the one or more subsequent error correction iterations.

17. The system of claim 13, wherein detecting the stall condition includes causing the processing device to:

store multiple consecutive syndromes generated by the plurality of error correction iterations; and identify a repeated pattern in the multiple consecutive syndromes.

18. The system of claim 13, wherein detecting the stall condition includes causing the processing device to:

determine a count of the plurality of error correction iterations satisfies an iteration count threshold; and determine a count of parity violations satisfies a parity violation count threshold.

* * * * *